(12) United States Patent
Shakh et al.

(10) Patent No.: US 11,758,821 B2
(45) Date of Patent: Sep. 12, 2023

(54) MAGNETIC MEMORY STRUCTURE

(71) Applicant: INDUSTRIAL TECHNOLOGY RESEARCH INSTITUTE, Hsinchu (TW)

(72) Inventors: Ziaur Rahaman Shakh, Zhudong Township (TW); I-Jung Wang, Zhudong Township (TW); Jeng-Hua Wei, Taipei (TW)

(73) Assignee: INDUSTRIAL TECHNOLOGY RESEARCH INSTITUTE, Hsinchu (TW)

( * ) Notice: Subject to any disclaimer, the term of this patent is extended or adjusted under 35 U.S.C. 154(b) by 68 days.

(21) Appl. No.: 17/545,794

(22) Filed: Dec. 8, 2021

(65) Prior Publication Data

US 2022/0102623 A1 Mar. 31, 2022

Related U.S. Application Data

(63) Continuation-in-part of application No. 16/514,523, filed on Jul. 17, 2019, now Pat. No. 11,227,990.

(51) Int. Cl.
*H01L 43/08* (2006.01)
*H10N 50/10* (2023.01)
(Continued)

(52) U.S. Cl.
CPC ............ *H10N 50/10* (2023.02); *H10B 61/20* (2023.02); *H10N 50/80* (2023.02)

(58) Field of Classification Search
CPC ....... H01L 43/02; H01L 27/228; H01L 43/10; H01L 27/222–228; G11C 11/161;
(Continued)

(56) References Cited

U.S. PATENT DOCUMENTS 8,716,818 B2 5/2014 Yoshikawa et al.
8,963,222 B2 2/2015 Guo
(Continued)

FOREIGN PATENT DOCUMENTS

TW 201709578 A 3/2017
TW 201729442 A 8/2017
(Continued)

OTHER PUBLICATIONS

Avci et al., "Current-induced switching in a magnetic insulator", Nature Materials, Nov. 21, 2016, pp. 1-7.
(Continued)

*Primary Examiner* — Shahed Ahmed
(74) *Attorney, Agent, or Firm* — Birch, Stewart, Kolasch & Birch, LLP

(57) ABSTRACT

A magnetic memory structure includes a heavy-metal layer, a plurality of magnetic tunneling junction (MTJ) layer, a conductive layer and an insulation layer. In an example, the pinned-layer of the MTJ layers are arranged in a string form and disposed over the barrier-layer. In an example also disclosed, the pinned-layer, the free-layer of the MTJ layers are arranged in a string form. Whereas the pinned-layers are disposed over the barrier-layer and the free-layers are disposed over the heavy-metal layer. The conductive layer is formed under the heavy-metal layer and includes a first conductive portion and a second conductive portion separated from each other and connected with two end of the heavy-metal layer respectively. The insulation layer fills up an interval between the first conductive portion and the second conductive portion. The conductive layer has an electric conductivity higher than that of the heavy-metal layer.

15 Claims, 10 Drawing Sheets

(51) Int. Cl.
*H10B 61/00* (2023.01)
*H10N 50/80* (2023.01)

(58) Field of Classification Search
CPC ............ G11C 11/1673; G11C 11/1675; G11C 2211/5615–5616; G11C 11/14–1697; G11C 2211/5616; H01F 10/3259; H01F 10/329; H01F 1/00–447; H10N 50/10; H10N 50/80; H10B 61/20; G01R 33/098; G11B 5/3909

See application file for complete search history.

(56) References Cited

U.S. PATENT DOCUMENTS

| | | | |
|---|---|---|---|
| 9,324,403 B2 | 4/2016 | Khalili Amiri et al. | |
| 9,646,670 B2 | 5/2017 | Lee et al. | |
| 9,691,458 B2 | 6/2017 | Ralph et al. | |
| 9,830,968 B2 | 11/2017 | Shimomura et al. | |
| 9,947,382 B2 | 4/2018 | Buhrman et al. | |
| 2014/0252439 A1 | 9/2014 | Guo | |
| 2014/0284736 A1* | 9/2014 | Toko | H10N 50/80 257/421 |
| 2015/0029779 A1* | 1/2015 | Lee | H10N 70/841 257/421 |
| 2016/0202330 A1* | 7/2016 | Yamamoto | H01F 10/3286 324/252 |
| 2017/0117027 A1 | 4/2017 | Braganca et al. | |
| 2018/0040807 A1 | 2/2018 | Saito et al. | |
| 2018/0040811 A1* | 2/2018 | Lee | H10N 50/10 |
| 2019/0074044 A1* | 3/2019 | Atulasimha | G11C 11/5607 |
| 2020/0212291 A1* | 7/2020 | Lin | H01F 10/3218 |
| 2020/0312391 A1* | 10/2020 | Sun | G06F 7/588 |

FOREIGN PATENT DOCUMENTS

| | | |
|---|---|---|
| TW | 201806206 A | 2/2018 |
| TW | I634680 B | 9/2018 |

OTHER PUBLICATIONS

Cubukcu et al., "Ultra-Fast Perpendicular Spin-Orbit Torque MRAM", IEEE Transactions on Magnetics, vol. 54, No. 4, Apr. 2018, 4 pages.
Fukami et al., "A spin-orbit torque switching scheme with collinear magnetic easy axis and current configuration", Nature Nanotechnology, vol. 11, Jul. 2016, pp. 621-625.
Garello et al., "Symmetry and magnitude of spin-orbit torques in ferromagnetic heterostructures", Nature Nanotechnology, vol. 8, Aug. 2013, pp. 587-593.
Hirsch, J. E., "Spin Hall Effect", Physical Review Letters, vol. 83, No. 9, Aug. 30, 1999, pp. 1834-1837.
Jungwirth et al., "Spin Hall effect devices", Nature Materials, vol. 11, May 2012, pp. 382-390.
Liu et al., "Current-Induced Switching of Perpendicularly Magnetized Magnetic Layers Using Spin Torque from the Spin Hall Effect", Physical Review Letters, vol. 109, Aug. 31, 2012, pp. 096602-1-096602-5.
Liu et al., "Spin-Torque Switching with the Giant Spin Hall Effect of Tantalum", Science, vol. 336, May 4, 2012, pp. 555-558.
Miron et al., "Perpendicular switching of a single ferromagnetic layer induced by in-plane current injection", Nature, vol. 476, Aug. 11, 2011, pp. 189-193.
Morota et al., "Indication of intrinsic spin Hall effect in 4d and 5d transition metals", Physical Review B, vol. 83, 2011, pp. 174405-1-174405-5.
Pai et al., "Spin transfer torque devices utilizing the giant spin Hall effect of tungsten", Applied Physics Letters, vol. 101, 2012, pp. 122404-1-122404-4.
U.S. Appl. No. 16/514,523, filed Jul. 17, 2019.

\* cited by examiner

MAGNETIC MEMORY STRUCTURE

The application is a continuation-in-part of U.S. patent application Ser. No. 16/514,523, filed on Jul. 17, 2019, the subject matter of which is incorporated herein by reference.

TECHNICAL FIELD

The present disclosure relates generally to a magnetic random access memory structure, and to spin-orbit torque magnetic random access memory with voltage controlled anisotropy.

BACKGROUND

The magnetic random access memory (MRAM) based on magnetic tunnel junction (MTJ) storage devices, which consists of two ferromagnetic layers separated by a magnetic insulating barrier have emerged as very promising candidates for future high performance nonvolatile memory and logic applications. In particular, the spin-transfer torque magnetic random access memory (STT-MRAM) has attracted much attention because of its CMOS compatibility, excellent nonvolatility, high writing and reading speed, and zero leakage power. In STT-MRAM, the magnetization of the free-layer can be changed by applying spin-polarized current directly through the MTJ cell without applying an external magnetic field, therefore magnetic interference is not present, which makes it possible to achieve low-power and high-density features of this technology. It has been also identified as a good candidate for the low-level cache memory, embedded flash of the system-on-chip processor, and as an ideal one-memory-for-all for small battery-operated appliances such as the Internet of Things (IoT).

Although STT-MRAM has attracted considerable attention worldwide due to its unique features, some significant challenges have to be addressed before this technology being commercialized. The technology is mature to the stage that silicon foundries are producing them. Despite its maturity, there is room for further improvement of its robustness. One of the major drawback of the STT-MRAM technology is its reliability issues such as read disturbance, read/write errors, retention, and possible oxide breakdown due to the identical read/write access paths.

To mitigate the limitations of STT-MRAM, an alternative technique of magnetization reversal method of magnetic tunnel junction (MTJ), namely, the spin-orbit torque (SOT) is proposed recently in three-terminal MTJs with in-plane as well as out-of-plane magnetization for the next MRAM generations. In SOT-MRAM, an in-plane charge current is injected into the heavy-metal (HM) layer of the three-terminal MTJ-based memory cells, a transverse pure-spin current is generated due to the spin-Hall effect (SHE) and/or interface Rashba effect. The accumulation of spin-polarized electrons at the interface of the HM/ferromagnetic (FM) free-layer exerts a spin-orbit torque on the FM layer which can switch the magnetization of the FM free-layer of MTJ. The advantage of three-terminal MTJ based SOT-MRAM over two-terminal MTJ based STT-MRAM is that the read and write paths are decoupled which improves the reliability of the tunneling barrier layer and device's endurance as well, because the write current does not flow through the tunneling barrier layer. Moreover, the read disturbance in SOT-MRAM is also alleviated due to the separate read and write paths. However, in SOT-MRAM at least two transistors must be used into a unit cell to perform the write/read operation, which discloses additional challenges in terms of memory density and write efficiency of this technology.

The voltage-controlled magnetic anisotropy (VCMA) is also proposed recently as alternative writing mechanisms for the next MRAM generations. In VCMA, an external voltage or electric field instead of a charge current is applied to modulate the interfacial magnetic anisotropy of ultrathin ferromagnet/oxide stacks, which can result in a change of magnetization orientation and stored bit value. Compared to STT-induced switching, the VCMA-induced switching allows for much lower power dissipation and which also results in increased memory density. However, the VCMA is suffering from an uncontrollable writing difficulties in dense arrays, which suffers additional challenges of this technology.

Thus, there is a need in the art for innovative structures that provide an improved MRAM device.

SUMMARY

According to one embodiment of this disclosure, a magnetic memory structure is provided. The magnetic memory structure includes a heavy-metal layer, a plurality of magnetic tunneling junction (MTJ) layers, a conductive layer and an insulation layer. The MTJ layers are disposed above the heavy-metal layer. The conductive layer is formed under the heavy-metal layer and includes a first conductive portion and a second conductive portion separated from each other and connected with two end of the heavy-metal layer respectively. The insulation layer fills up an interval between the first conductive portion and the second conductive portion. The conductive layer has an electric conductivity higher than that of the heavy-metal layer.

According to another embodiment of this disclosure, a magnetic memory structure is provided. The magnetic memory structure includes a heavy-metal layer, a MTJ layer, a conductive layer and an insulation layer. The MTJ layer is disposed above the heavy-metal layer. The conductive layer is formed under the heavy-metal layer and comprises a first conductive portion and a second conductive portion separated from each other and connected with two end of the heavy-metal layer respectively. The insulation layer fills up an interval between the first conductive portion and the second conductive portion. The conductive layer has an electric conductivity higher than that of the heavy-metal layer.

The above and other aspects of this disclosure will become better understood with regard to the following detailed description of the preferred but non-limiting embodiments. The following description is made with reference to the accompanying drawings.

Figure 1:
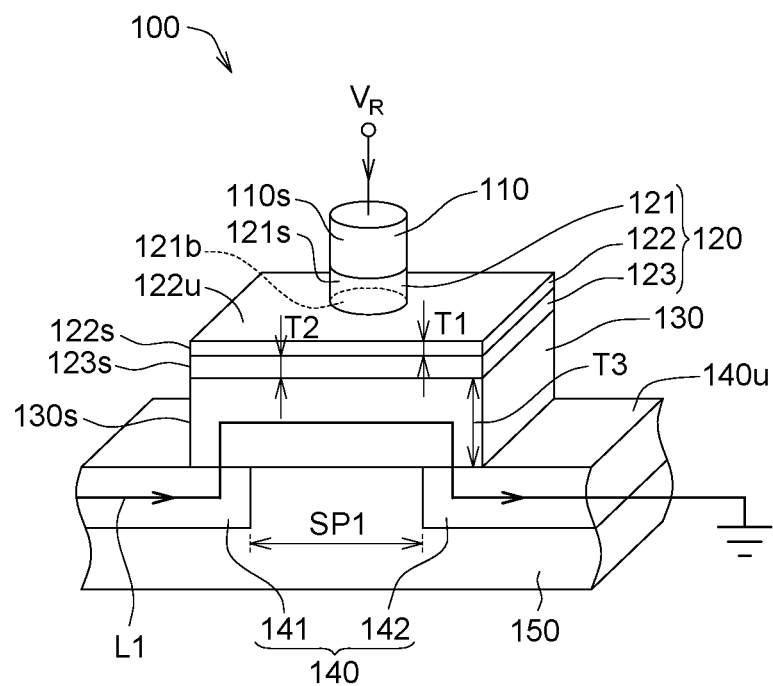
FIGS. 1 and 2 illustrate a schematic diagram of a magnetic memory structure according to an embodiment of the present disclosure.

In the following detailed description, for purposes of explanation, numerous specific details are set forth in order to provide a thorough understanding of the disclosed embodiments. It will be apparent, however, that one or more embodiments may be practiced without these specific details. In other instances, well-known structures and devices are schematically shown in order to simplify the drawing.

DETAILED DESCRIPTION

Figure 2:
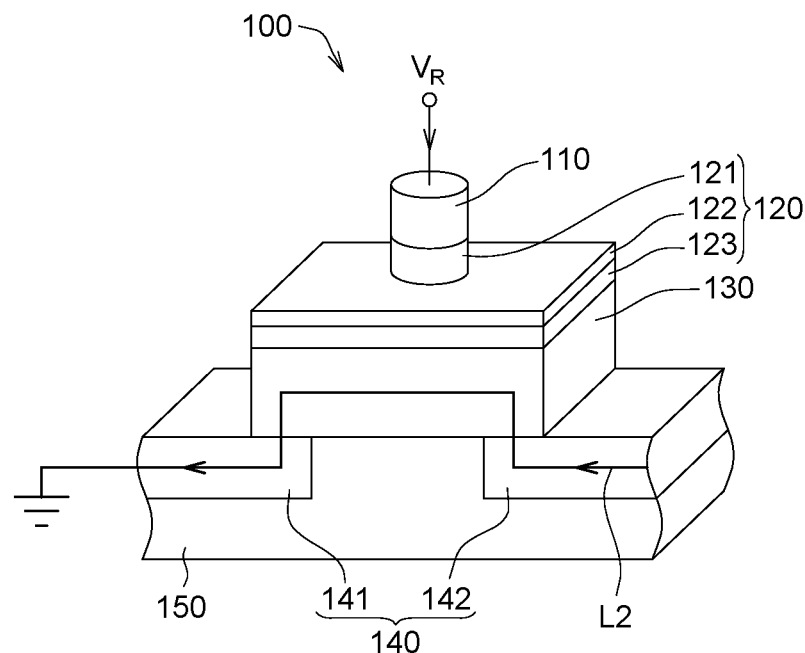
Figure 3:
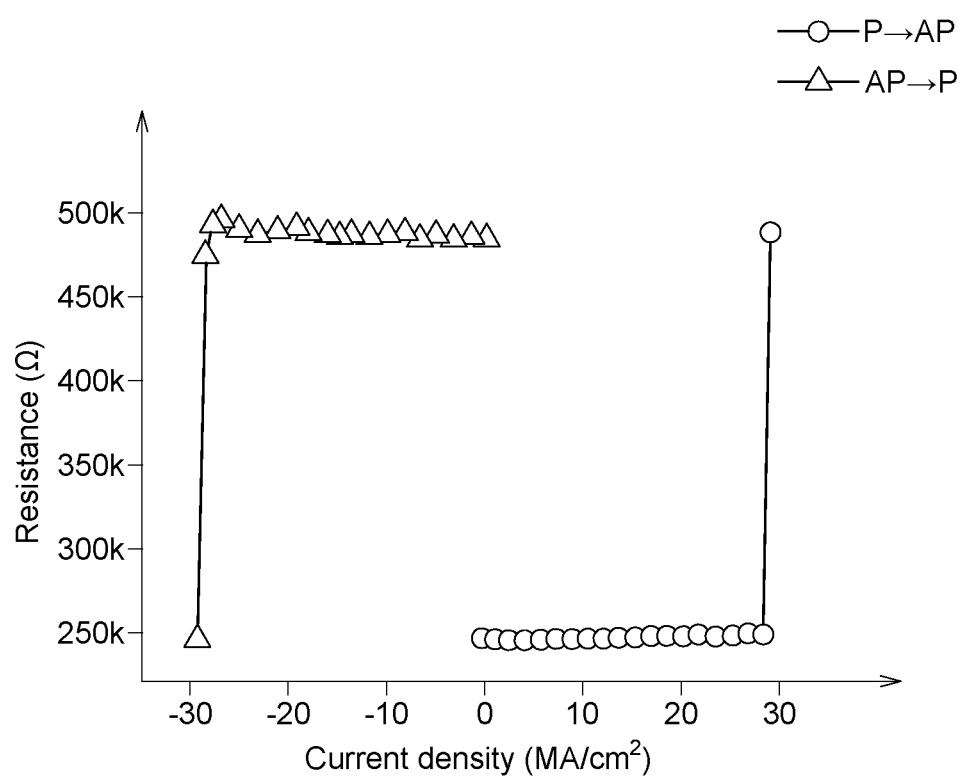
FIG. 3 illustrates a resistance versus current density (R-J) curve for the magnetic memory structure.

Referring to FIGS. 1 to 3, FIGS. 1 and 2 illustrate a schematic diagram of a magnetic memory structure 100 according to an embodiment of the present disclosure, and FIG. 3 illustrates a resistance versus current density (R-J) curve for the magnetic memory structure 100.

The magnetic memory structure 100 is a kind of magnetic random access memory (MRAM), for example, a spin-orbit torque (SOT)-MRAM. The magnetic memory structure 100 includes a top-electrode 110, a magnetic tunneling junction (MTJ) layer 120, a heavy-metal layer 130, a conductive layer 140 and an insulation layer 150.

The top-electrode 110 is formed on and above the MTJ layer 120. The top-electrode 110 is configured to receive a read voltage $V_R$ applied by a voltage source (not illustrated) for read the state of the MTJ layer 120.

The MTJ layer 120 includes a pinned-layer 121, a barrier-layer 122 and a free-layer 123. The barrier-layer 122 is formed under the pinned-layer 121, and the free-layer 123 is formed under the barrier-layer 122, that is, the barrier-layer 122 lies between the pinned-layer 121 and the free-layer 123.

The top-electrode 110 and the pinned-layer 121 of the MTJ layer 120 have a lateral surface 110s and a lateral surface 121s respectively. In one etching process, the top-electrode 110 and the pinned-layer 121 are etched, by the same mask, to form the lateral surfaces 110s and 121s, and thus the lateral surfaces 110s and 121s are substantially aligned with each other. As shown in FIG. 1, the top-electrode 110 and the pinned-layer 121 are shaped into same shape, for example, elliptic shape, polygon shape, circular shape, etc.

In addition, the barrier-layer 122 has a first upper surface 122u, the pinned-layer 121 has a lower surface 121b, wherein area of the first upper surface 122u is larger than area of the lower surface 121b. As illustrated in FIG. 1, the lower surface 121b of the pinned-layer 121 is entirely located at the first upper surface 122u of the barrier-layer 122.

Since the barrier-layer 122 is made of a material different form that of the pinned-layer 121, the barrier-layer 122 could serve as an etching stop layer for obtaining accurate thicknesses of the pinned-layer 121 and/or the barrier-layer 122. To provide etching stop-on-barrier, the first upper surface 122u of the barrier-layer 122 is larger than the lower surface 121b of the pinned-layer 121. In an embodiment, the barrier-layer 122 is made of an insulation material including Mg, oxygen or combination thereof which is different form magnetic material of the pinned-layer 121.

As illustrated in FIG. 1, the heavy-metal layer 130 is formed under the free-layer 123. The barrier-layer 122, the free-layer 123 and the heavy-metal layer 130 have a first lateral surface 122s, a second lateral surface 123s and a third lateral surface 130s respectively. In one etching process, the barrier-layer 122, the free-layer 123 and the heavy-metal layer 130 are etched, by the same mask, to form the first lateral surface 122s, the second lateral surface 123s and the third lateral surface 130s, and thus the first lateral surface 122s, the second lateral surface 123s and the third lateral surface 130s are substantially aligned (or flush) with each other. As shown in FIG. 1, the barrier-layer 122, the free-layer 123 and the heavy-metal layer 130 are shaped into the same polygonal shape, for example, rectangular shape or square shape.

In some embodiments, the pinned-layer 121 may include a single layer or a composite layer. In some embodiments, the pinned-layer 121 may include a single layer of, for example, cobalt iron (CoFe) alloy, cobalt iron boron (CoFeB) alloy, or cobalt nickel (CoNi) alloy. In some embodiments, the pinned-layer 121 may include a composite layer of, for example, cobalt (Co)/platinum (Pt), cobalt (Co)/nickel (Ni), or cobalt (Co)/palladium (Pd).

In some embodiments, the barrier-layer 122 may include magnesium oxide (MgO) or aluminum oxide (AlOx). In some embodiments, the thickness T1 of the barrier-layer 122 is in a range from about 0.5 nm to 2 nm.

In some embodiments, the free-layer 123 may include a single layer or a composite layer. In some embodiments, the free-layer 123 may include a single layer of, for example, iron (Fe), cobalt (Co), nickel (Ni), gadolinium (Gd), terbium (Tb), cobalt iron boron (CoFeB) alloy, or cobalt iron (CoFe) alloy. In some embodiments, the free-layer 123 may include a composite layer of, for example, cobalt iron boron (CoFeB) alloy/tantalum (Ta)/cobalt iron boron (CoFeB) alloy or cobalt iron (CoFe) alloy/tantalum (Ta)/cobalt iron (CoFe). In addition, in some embodiments, the thickness T2 of the free-layer 123 is in a range from about 1 nm to about 3 nm.

In some embodiments, the heavy-metal layer 130 may be made of a material including Tantalum (Ta), Tungsten (W), Platinum (Pt), Palladium (Pd), Hafnium (Hf), Niobium (Nb), Molybdenum (Mo), Gold (Au) or an alloy thereof, but not limited thereto. In some embodiments, the thickness T3 of the heavy-metal layer 130 is smaller than about 10 nm.

The conductive layer 140 is formed under the heavy-metal layer 130. The conductive layer 140 includes a first conductive portion 141 and a second conductive portion 142 separated from each other, and the first conductive portion 141 and the second conductive portion 142 are connected to two ends of the heavy-metal layer 130. The conductive layer 140 has an electric conductivity higher than that of the heavy-metal layer 130. In comparison with the structure without the conductive layer 140, the conductive layer 140 in the present embodiment could increase the electric conductivity of the whole of the heavy-metal layer 130 and the conductive layer 140, and thus it could decease the driving voltage for the electrical current L1 of FIG. 1 and the electrical current L2 of FIG. 2. In addition, in an embodiment, the conductive layer 140 is made of a material including Ag, Cu, Au, Al or combination thereof.

As illustrated in FIG. 1, in a write program, the electrical current L1 is applied to flow through the first conductive portion 141, the heavy-metal layer 130 and the second conductive portion 142 in order for switching the state of the free-layer 123 of the MTJ layer 120 to state "1" from state "0" (or to state "0" from state "1"), wherein the state "0" represents that, for example, the magnetization directions of the pinned-layer 121 and the free-layer 123 are the same, and the state "1" represents that, for example, the magnetization directions of the pinned-layer 121 and the free-layer 123 are opposite.

As illustrated in FIG. 2, in another write program, the reverse electrical current L2 is applied to flow through the second conductive portion 142, the heavy-metal layer 130 and the first conductive portion 141 in order for switching the state of the free-layer 123 of the MTJ layer 120 to state "0" from state "1" (or to state "1" from state "0").

In FIGS. 1 to 3, the read voltage $V_R$ is applied between the top-electrode 110 and the first conductive portion 141 or between the top-electrode 110 and second conductive portion 142 to read the parallel (P) state or anti-parallel (AP) state resistances during the write operation. In an embodiment, the required read voltage $V_R$ is, for example, 0.1 Volt (V), more or less.

Since the conductive layer 140 is made of a material different form that of the heavy-metal layer 130, the conductive layer 140 could serve as an etching stop layer for obtaining accurate thicknesses of the heavy-metal layer 130. In the present embodiment, the thickness T3 of the heavy-metal layer 130 could be accurately controlled in range of 3 nm~10 nm, more or less.

As illustrated in FIG. 1, the conductive layer 140 has a second upper surface 140u exposed from the heavy-metal layer 130. In other words, as illustrated in FIG. 1, the conductive layer 140 extends beyond the lateral surface 130s of the heavy-metal layer 130, the first lateral surface 122s of the barrier-layer 122 and the second lateral surface 123s of the free-layer 123.

As illustrated in FIG. 1, the insulation layer 150 fills up an interval SP1 between the first conductive portion 141 and the second conductive portion 142 and formed under the first conductive portion 141 and the second conductive portion 142. In an embodiment, the insulation layer 150 is made of a material including, for example, silicon dioxide ($SiO_2$).

Figure 8:
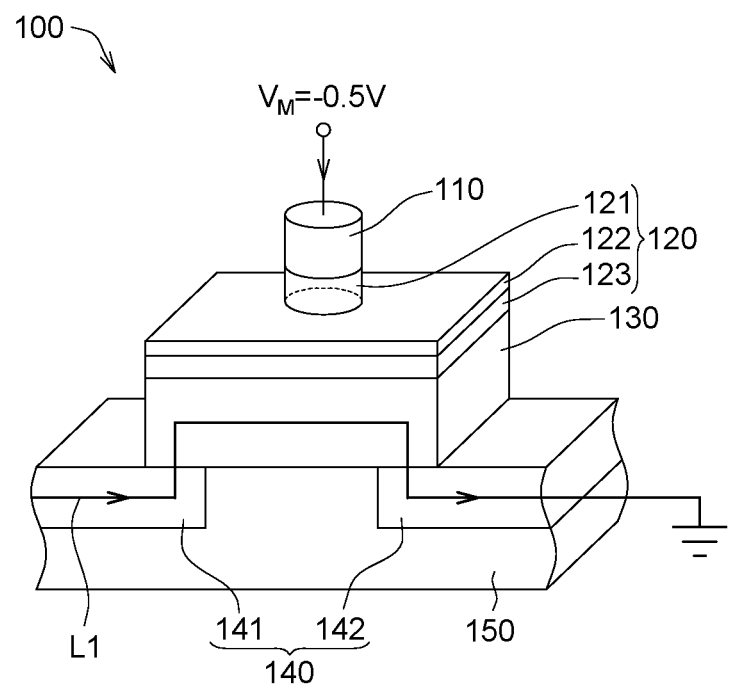
Figure 9:
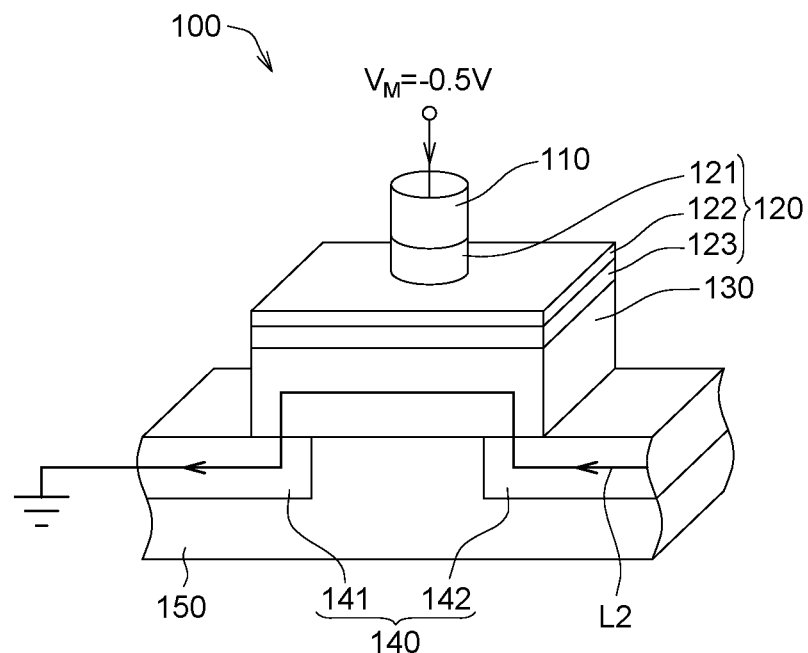
Figure 10:
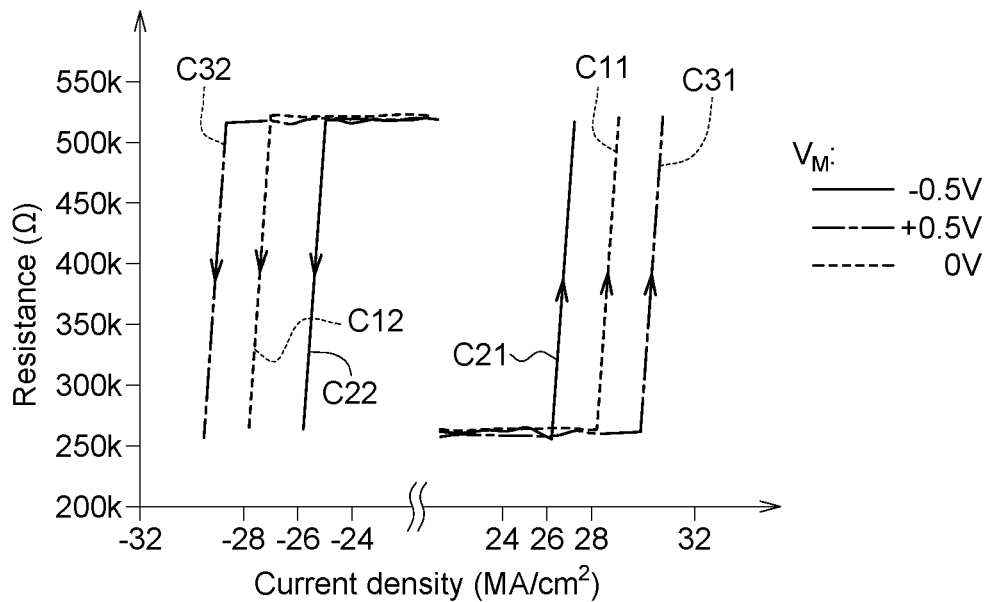
FIG. 10 illustrates a resistance versus current density (R-J) curve for the magnetic memory structure.

Referring to FIGS. 4 to 10, FIGS. 4 to 9 illustrate schematic diagrams of the magnetic memory structure 100 according to another embodiment of the present disclosure, and FIG. 10 illustrates a resistance versus current density (R-J) curve for the magnetic memory structure 100.

As illustrated in FIG. 4 to FIG. 9, a modulating voltage $V_M$ is applied, by an external voltage source, to modulate the energy barrier of the MTJ layer 120. Parallelly, the read voltage $V_R$ is applied between the top-electrode 110 and first conductive portion 141 or between the top-electrode 110 and second conductive portion 142 to read the P state or AP state resistances during the write operation.

Figure 4:
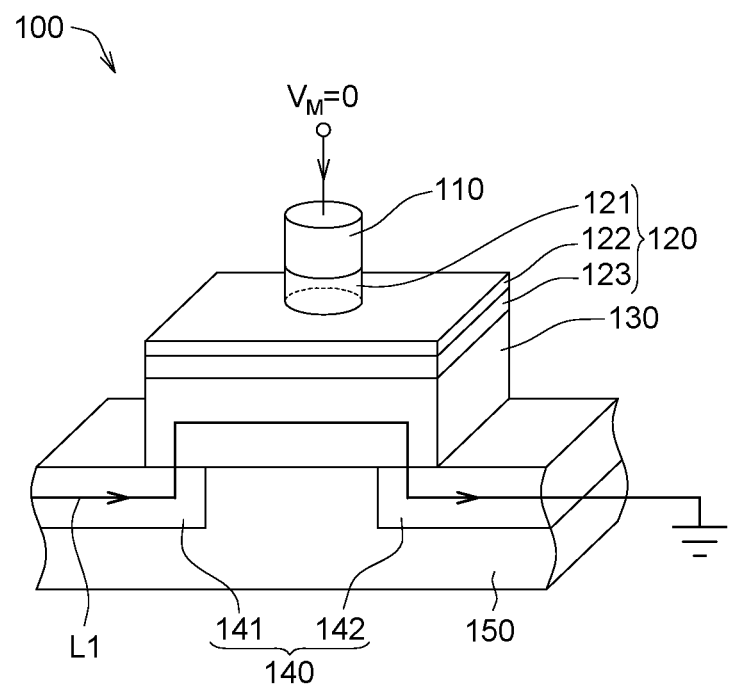
FIGS. 4 to 9 illustrate schematic diagrams of the magnetic memory structure according to another embodiment of the present disclosure.

As illustrated in FIG. 4, in a write program, the electrical current L1 is applied to flow through the first conductive portion 141, the heavy-metal layer 130 and the second conductive portion 142 in order for switching the state of the free-layer 123 of the MTJ layer 120 to state "1" from state "0" (or to state "0" from state "1"), wherein the voltage $V_M$ is "0".

Figure 5:
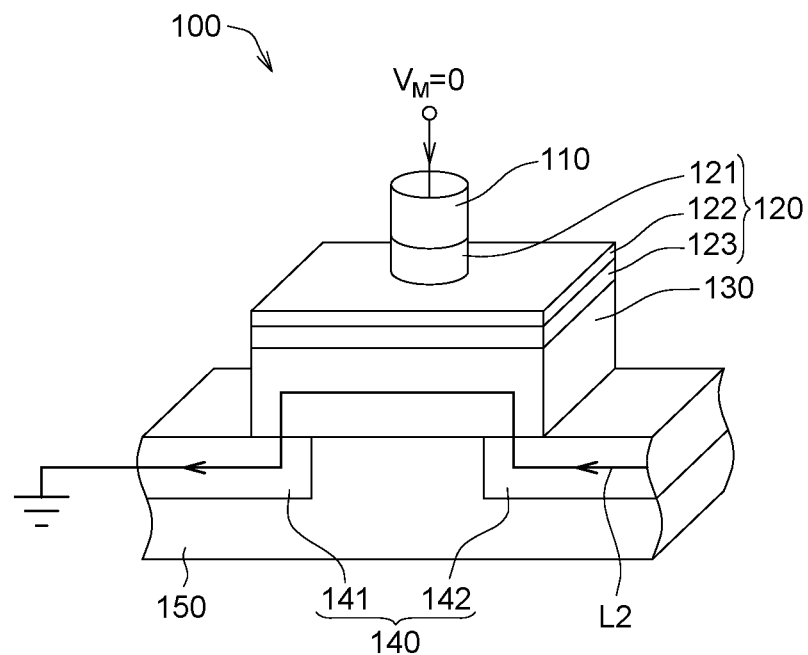

As illustrated in FIG. 5, in another write program, the reverse electrical current L2 is applied to flow through the second conductive portion 142, the heavy-metal layer 130 and the first conductive portion 141 in order for switching the state of the free-layer 123 of the MTJ layer 120 to state "0" from state "1" (or to state "1" from state "0"), wherein the voltage $V_M$ is "0".

Figure 6:
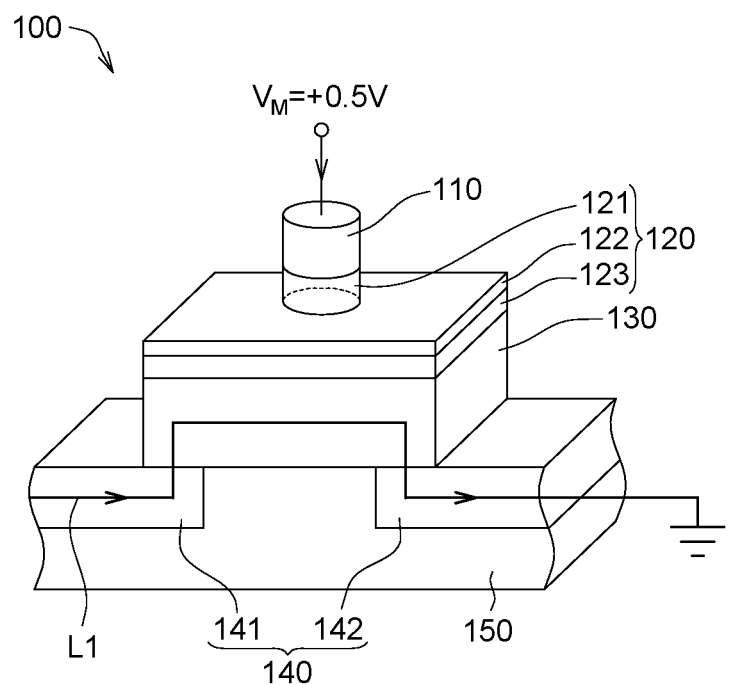

As illustrated in FIG. 6, in a write program, the electrical current L1 is applied to flow through the first conductive portion 141, the heavy-metal layer 130 and the second conductive portion 142 in order for switching the state of the free-layer 123 of the MTJ layer 120 to state "1" from state "0" (or to state "0" from state "1"), wherein the voltage $V_M$ is +0.5 V. In another embodiment of this disclosure the modulating voltage $V_M$ is higher than the +0.5V or lower than the +0.5V.

Figure 7:
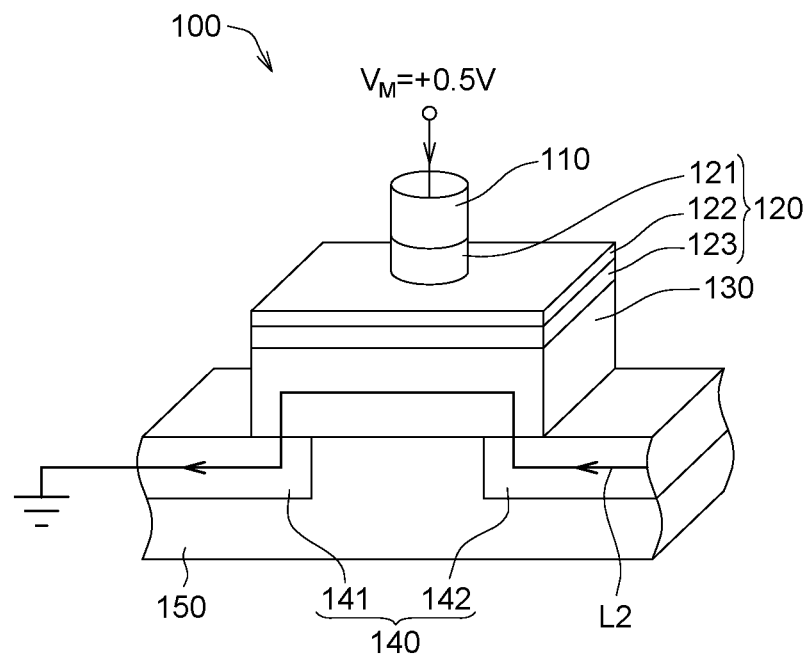

As illustrated in FIG. 7, in another write program, the reverse electrical current L2 is applied to flow through the second conductive portion 142, the heavy-metal layer 130 and the first conductive portion 141 in order for switching the state of the free-layer 123 of the MTJ layer 120 to state "0" from state "1" (or to state "1" from state "0"), wherein the voltage $V_M$ is +0.5 V. In another embodiment of this disclosure the modulating voltage $V_M$ is higher than the +0.5V or lower than the +0.5V.

As illustrated in FIG. 8, in a write program, the electrical current L1 is applied to flow through the first conductive portion 141, the heavy-metal layer 130 and the second conductive portion 142 in order for switching the state of the free-layer 123 of the MTJ layer 120 to state "1" from state "0" (or to state "0" from state "1"), wherein the voltage $V_M$ is −0.5 V. In another embodiment of this disclosure the modulating voltage $V_M$ is higher than the −0.5V or lower than the −0.5V.

As illustrated in FIG. 9, in another write program, the reverse electrical current L2 is applied to flow through the second conductive portion 142, the heavy-metal layer 130 and the first conductive portion 141 in order for switching the state of the free-layer 123 of the MTJ layer 120 to state "0" from state "1" (or to state "1" from state "0"), wherein the voltage $V_M$ is −0.5 V. In another embodiment of this disclosure the modulating voltage $V_M$ is higher than the −0.5V or lower than the −0.5V.

In SOT-MRAM cell, an in-plane charge current flows through the heavy-metal layer 130. Due to the spin-Hall effect (SHE) of the heavy-metal layer and/or Rashba effect of the heavy-metal layer/free-layer interface, spin-polarized electrons accumulate at the interface of the heavy-metal layer/free-layer, resulting in a transverse pure spin current flowing into the free-layer. Thus, in a SOT-MRAM cell, the spin current does not come from the tunnel barrier and the tunnel barrier does not degrade during write access. As shown in curves C11 and C12 of FIG. 10, the positive current (curve C11) drives the SOT-MRAM cell into a high-resistance state (HRS) or antiparallel (AP) state, while the negative current (opposite direction) (curve C12) drives the SOT-MRAM cell into a low-resistance state (LRS) or parallel (P) state. Thus, the free-layer magnetization could be changed by applying electrical current directly through the heavy-metal layer without applying an external magnetic field. As shown in C11 of FIG. 10, when the current density of the positive electrical current reaches a threshold value (for example, 28 MA/cm$^2$ for curve C11 shown in FIG. 10), the state of the free-layer 123 of the MTJ layer 120 is allowed to change. When the current density of the negative current (opposite direction) is lower than a threshold value (for example, −28 MA/cm$^2$ for the curve C12 shown in FIG. 10), the state of the free-layer 123 of the MTJ layer 120 is allowed to change.

As illustrated in curve C11 and C12 of FIG. 10, when the voltage $V_M$ is 0 V or without bias condition, the threshold value of the switching from P state to AP state and AP state to P state is similar to the switching of SOT-MRAM cell, as described above.

As illustrated in curve C21 or C22 of FIG. 10, when the voltage $V_M$ is −0.5 V bias, the threshold value of the switching from P state to AP state and AP state to P state is reduced, for example, to +26 MA/cm$^2$ (for the curve C21) or −26 MA/cm$^2$ (for the curve C22) from +28 MA/cm$^2$ (for the curve C11) or −28 MA/cm$^2$ (for the curve C12).

As illustrated in curve C31 or C32 of FIG. 10, when the voltage $V_M$ is +0.5 V bias, the threshold value of the switching from P state to AP state and AP state to P state is increased, for example, to +31 MA/cm$^2$ (for the curve C31) or −31 MA/cm$^2$ (for the curve C32) from +28 MA/cm$^2$ (for the curve C11) or −28 MA/cm$^2$ (for the curve C12).

Figure 11:
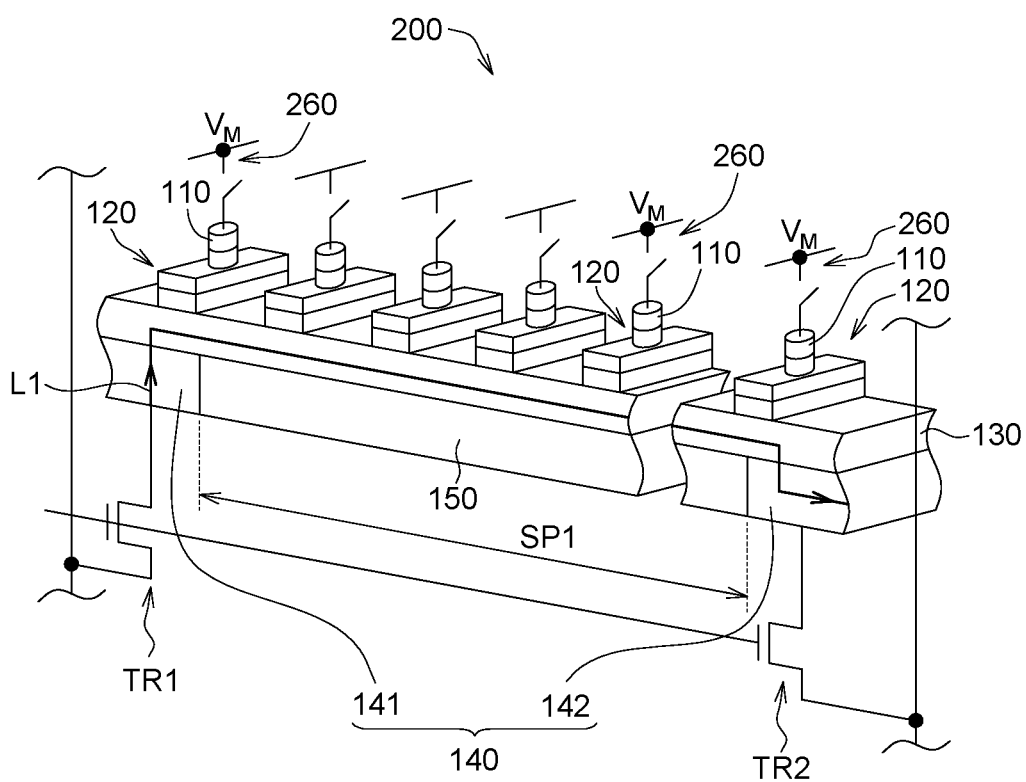
FIG. 11 illustrates a schematic diagram of a magnetic memory structure according to another embodiment of the present disclosure.

For example, as shown in FIG. 11, FIG. 11 illustrates a schematic diagram of a magnetic memory structure 200 according to another embodiment of the present disclosure. The voltage $V_M$ is for controlling threshold modulation effects as described above could be applied for voltage controlled magnetic anisotropy (VCMA)-assisted multibit SOT cell structure for future high-density nonvolatile memory (NVM) applications.

As shown in FIG. 11, one top-electrode 110 is formed above the corresponding MTJ layer 120, and one switch 260 is electrically connected with the corresponding top-electrode 110 for deciding whether the bias is applied to the top-electrode 110.

Referring to FIG. 11, the magnetic memory structure 200 includes a number of the top-electrode 110, a number of the MTJ layer 120, the heavy-metal layer 130, the conductive layer 140, the insulation layer 150 and a number of switches 260.

In the present embodiment, the heavy-metal layer 130 is formed under all MTJ layers 120, and the MTJ layers 120 overlap the interval SP1 between the first conductive portion 141 and the second conductive portion 142 up and down. In the magnetic memory structure 200, plural states of plural MTJ layers 120 are controlled to change by the electrical current flowing through two conductive portions (the first conductive portion 141 and the second conductive portion 142).

As shown in FIG. 11, the insulation layer 150 fills up the interval SP1 between the first conductive portion 141 and the second conductive portion 142. In other words, there is no any conductive portion disposed with the interval SP1. In addition, the first transistor TR1 is electrically connected with the first conductive portion 141, and the second transistor TR2 is electrically connected with the second conductive portion 142. The passage of the electrical current L1 to the first conductive portion 141 is controlled by the first transistor TR1, and the passage of the electrical current L2 to the second conductive portion 142 is controlled by the second transistor TR2. In the present embodiment, the states of the free-layers 123 of several MTJ layers 120 could be controlled/switched by only two transistors (first transistor TR1 and the second transistor TR2).

Figure 12:
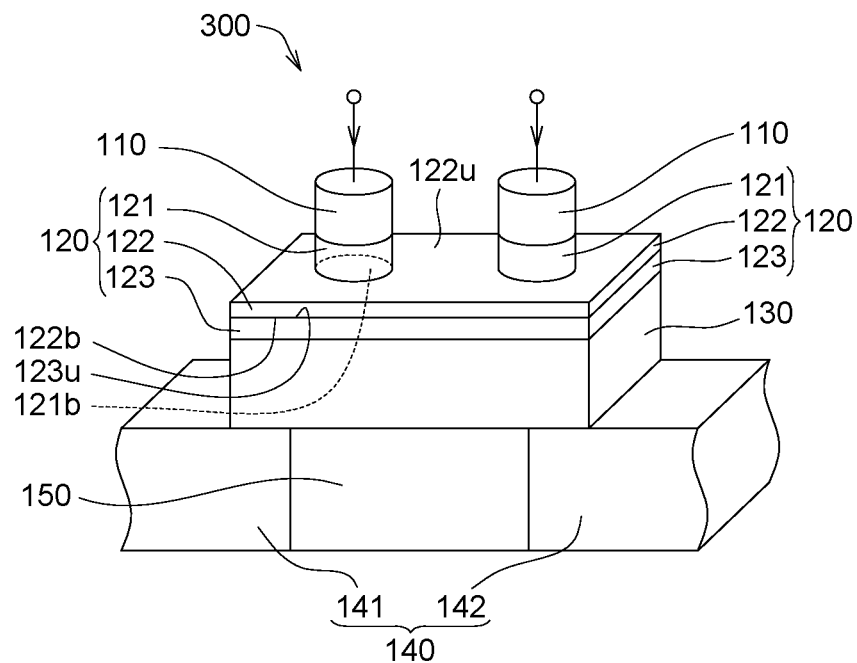
FIG. 12 illustrates a schematic diagram of a magnetic memory structure according to an embodiment of the present disclosure.

Referring to FIG. 12, FIG. 12 illustrates a schematic diagram of a magnetic memory structure 300 according to an embodiment of the present disclosure.

The magnetic memory structure 300 includes two top-electrodes 110, two pinned-layers 121, the barrier-layer 122, the free-layer 123, the heavy-metal layer 130, the conductive layer 140 and the insulation layer 150. The top-electrodes 110 and pinned-layers 121 are arranged in a string form and disposed above the barrier-layer 122. The barrier-layer 122 is formed under the pinned-layer 121, and the free-layer 123 is formed under the barrier-layer 122, and the heavy-metal layer 130 is formed under the free-layer 123. The conductive layer 140 is formed under the heavy-metal layer 130 and includes the first conductive portion 141 and the second conductive portion 142 separated from each other and connected with two end of the heavy-metal layer 130 respectively. The insulation layer 150 fills up an interval between the first conductive portion 141 and the second conductive portion 142.

Each MTJ layer 120 includes the pinned-layer 121, the barrier-layer 122 and the free-layer 123, and the barrier-layer 122 lies between the pinned-layer 121 and the free-layer 123. In the present embodiment, the pinned-layers 121 of the MTJ layers 120 are separated from each other, the barrier-layers 122 of the MTJ layers 120 are connected with each other to form a continuous barrier-layer, and the free-layers 123 of the MTJ layers 120 are connected with each other to form a continuous free-layer.

As shown in FIG. 12, each barrier-layer 122 has the upper surface 122$u$, each pinned-layer 121 has the lower surface 121$b$, and an area of the first upper surface 122$u$ is larger than that of the lower surface 121$b$. Each barrier-layer 122 has a lower surface 122$b$, each free-layer 123 has an upper surface 123$u$, and an area of the lower surface 122$b$ is equal to that of the upper surface 123$u$.

Figure 13:
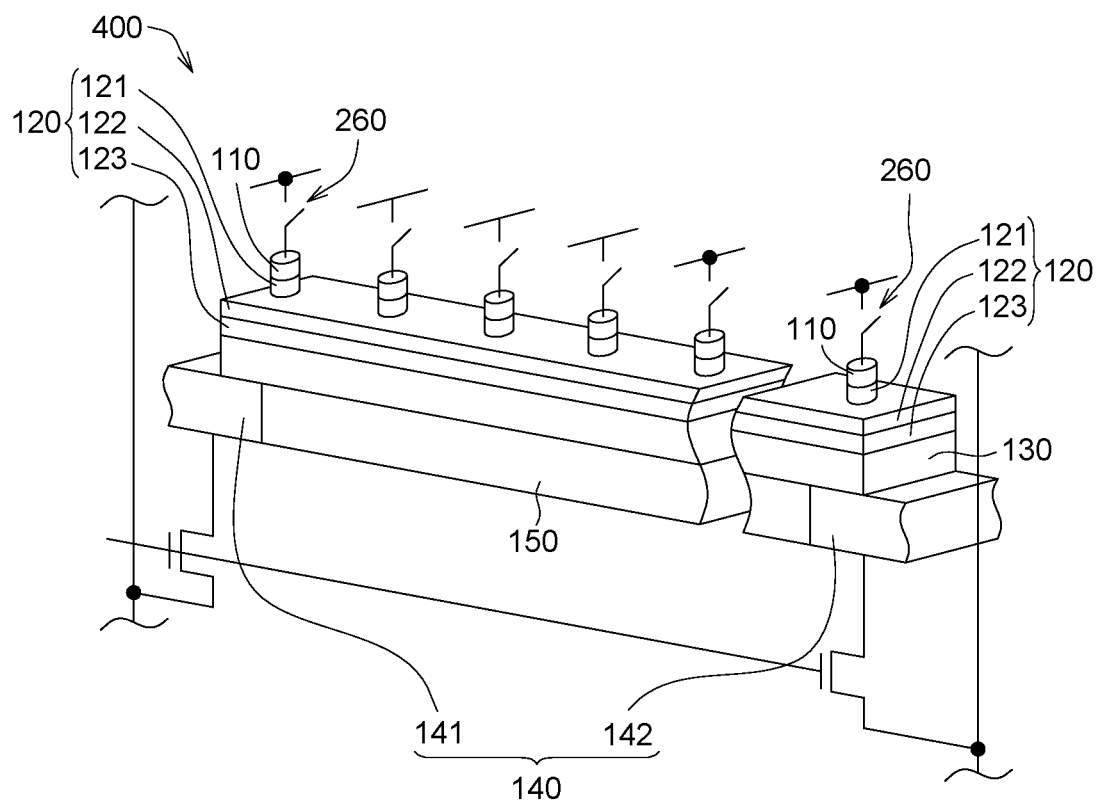
FIG. 13 illustrates a schematic diagram of a magnetic memory structure according to an embodiment of the present disclosure.

Referring to FIG. 13, FIG. 13 illustrates a schematic diagram of a magnetic memory structure 400 according to an embodiment of the present disclosure. The magnetic memory structure 400 includes a number of the top-electrodes 110, the pinned-layers 121, the barrier-layer 122, the free-layer 123, the heavy-metal layer 130, the conductive layer 140, the insulation layer 150 and a number of the switches 260.

The magnetic memory structure 400 includes the features similar to or the same as that of the magnetic memory structure 300 except that the number of the top-electrodes 110 and the number of the pinned-layers 121 are, for example, N, wherein N is positive integer equal to or greater than 3. As shown in FIG. 13, the barrier-layer 122 of the MTJ layers 120 are connected to form a continuous barrier-layer, and the free-layers 123 of the MTJ layers 120 are connected to form a continuous free-layer.

Figure 14:
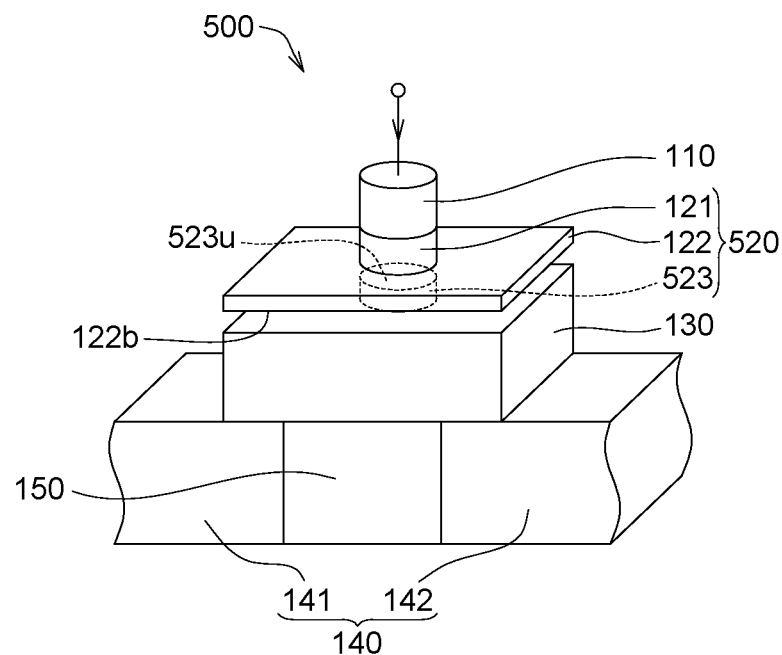
FIG. 14 illustrates a schematic diagram of a magnetic memory structure according to an embodiment of the present disclosure.

Referring to FIG. 14, FIG. 14 illustrates a schematic diagram of a magnetic memory structure 500 according to an embodiment of the present disclosure.

The magnetic memory structure 500 includes one top-electrode 110, one MTJ layers 520, the heavy-metal layer 130, the conductive layer 140, the insulation layer 150. The MTJ layer 520 is disposed above the heavy-metal layer 130. The conductive layer 140 is formed under the heavy-metal layer 130 and includes the first conductive portion 141 and the second conductive portion 142 separated from each other and connected with two end of the heavy-metal layer 130 respectively. The insulation layer 150 fills up an interval between the first conductive portion 141 and the second conductive portion 142.

The MTJ layer 520 includes the pinned-layer 121, the barrier-layer 122 and a free-layer 523, and the barrier-layer 122 lies between the pinned-layer 121 and the free-layer 523. The magnetic memory structure 500 includes the features similar to or the same as that of the magnetic memory structure 100 except that the free-layer 523 has structure different form that of the free-layer 123.

Furthermore, as shown in FIG. 14, the barrier-layer 122 has the lower surface 122b, the free-layers 523 has an upper surface 523u, and an area of the lower surface 122b is larger than that of the upper surface 523u. In addition, the free-layers 523 and the pinned-layer 121 overlap completely in top view. The free-layers 523 is shaped into a shape the same as or similar to that that of the pinned-layer 121. In addition, there is an air-gap between the barrier-layer 122 and heavy-metal layer 130 except the area of free-layer region. In other embodiments of the present disclosure, there is an insulation layer (for example, SiO2) between the barrier-layer 122 and heavy-metal layer 130 except the area of free-layer region (not shown here).

Figure 15:
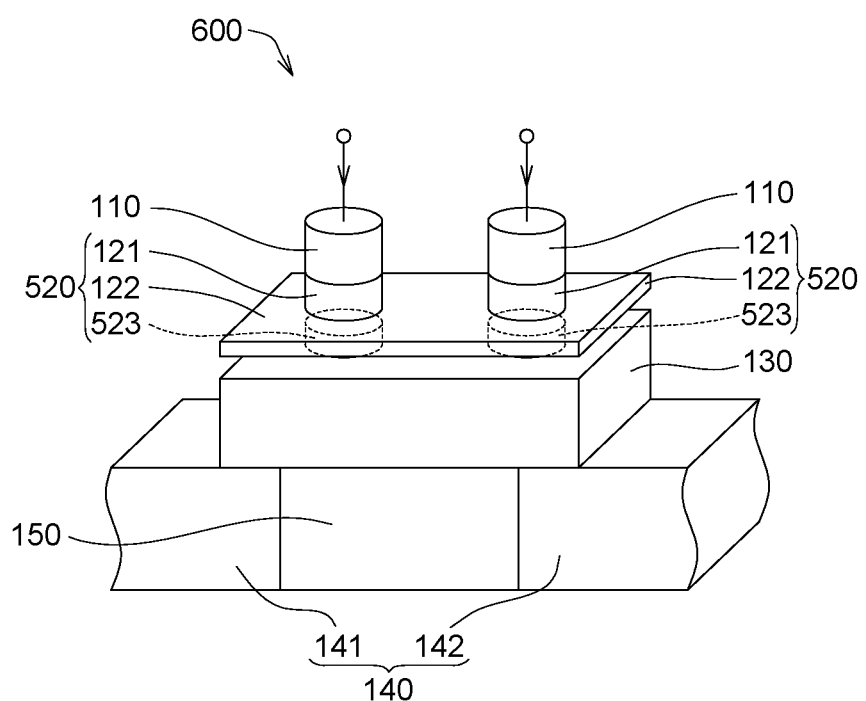
FIG. 15 illustrates a schematic diagram of a magnetic memory structure according to an embodiment of the present disclosure.

Referring to FIG. 15, FIG. 15 illustrates a schematic diagram of a magnetic memory structure 600 according to an embodiment of the present disclosure.

The magnetic memory structure 600 includes two top-electrodes 110, two pinned-layers 121, the barrier-layer 122, two free-layers 523, the heavy-metal layer 130, the conductive layer 140 and the insulation layer 150. The top-electrode 110, and pinned-layer 121, free-layer 523 of the MTJ layers 520 are arranged in a string form and disposed above the heavy-metal layer 130. Whereas the barrier-layer 122 of the MTJ layers 520 is placed as a single layer.

Each MTJ layer 520 includes the pinned-layer 121, the barrier-layer 122 and the free-layer 523, and the barrier-layer 122 lies between the pinned-layer 121 and the free-layer 523. In the present embodiment, the pinned-layers 121 of the MTJ layers 520 are separated from each other, the barrier-layers 122 of the MTJ layers 520 are connected with each other to form a continuous barrier-layer, and the free-layers 523 of the MTJ layers 520 are separated from each other.

Figure 16:
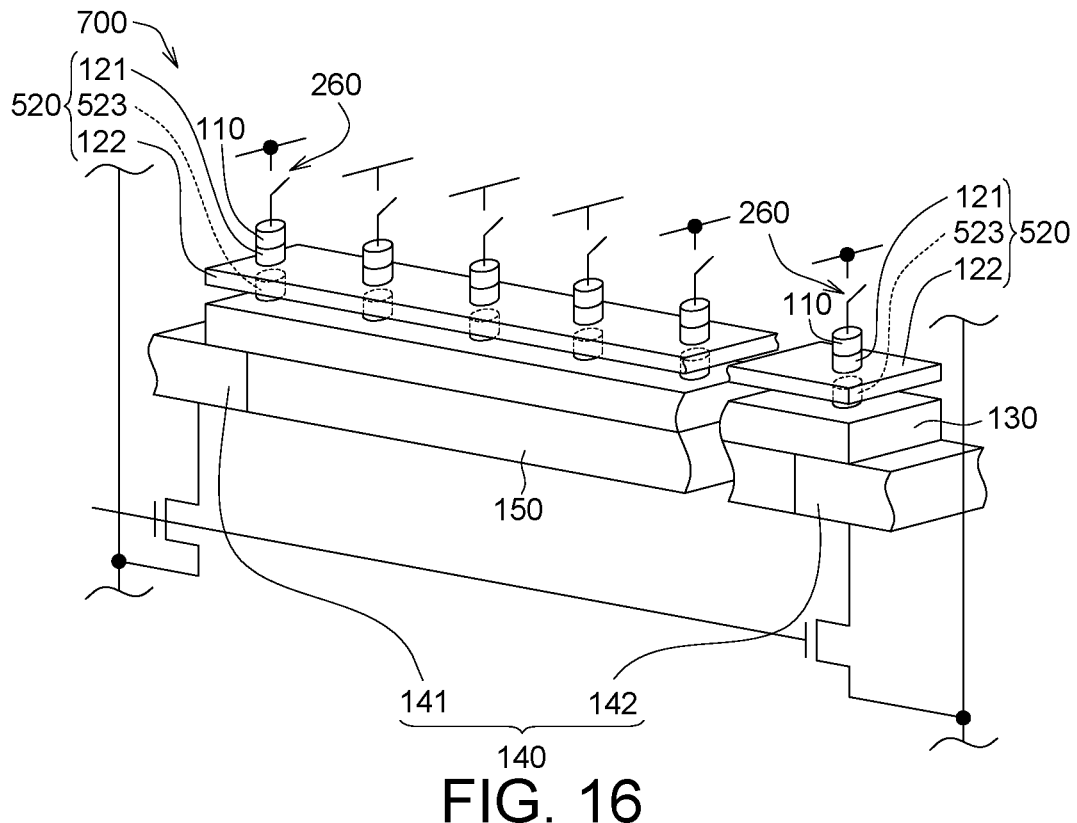
FIG. 16 illustrates a schematic diagram of a magnetic memory structure according to an embodiment of the present disclosure.

Referring to FIG. 16, FIG. 16 illustrates a schematic diagram of a magnetic memory structure 700 according to an embodiment of the present disclosure. The magnetic memory structure 700 includes a number of the top-electrodes 110, and a number of the pinned-layers 121, a number of free-layers 523 of the MTJ layers 520, the heavy-metal layer 130, the conductive layer 140, the insulation layer 150 and a number of the switches 260.

The magnetic memory structure 700 includes the features similar to or the same as that of the magnetic memory structure 600 except that the number of the top-electrodes 110, the number of the pinned-layers 121, and the number of the free-layers 523 are, for example, N, wherein N is positive integer equal to or greater than 3. As shown in FIG. 16, the barrier-layer 122 of the MTJ layers 520 are connected to form a continuous barrier-layer.

Figure 17:
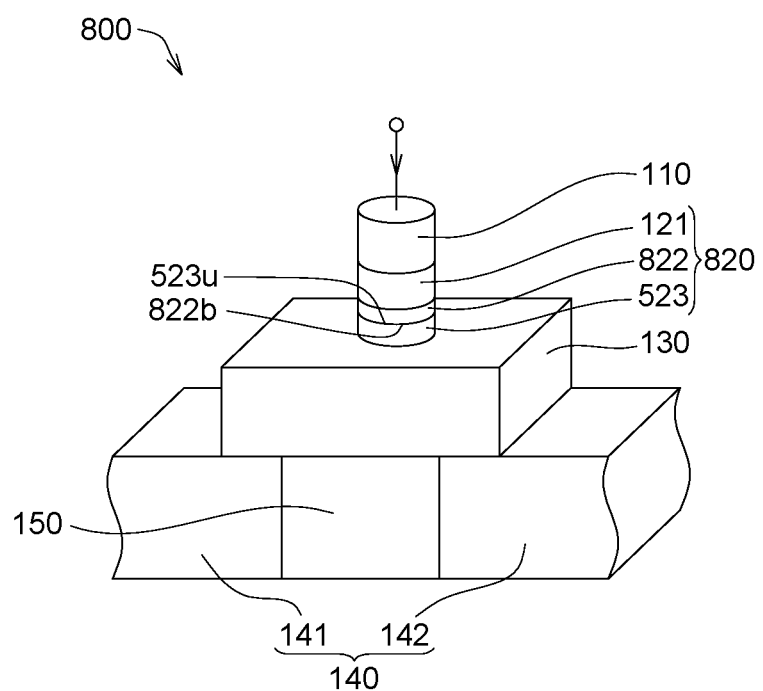
FIG. 17 illustrates a schematic diagram of a magnetic memory structure according to an embodiment of the present disclosure.

Referring to FIG. 17, FIG. 17 illustrates a schematic diagram of a magnetic memory structure 800 according to an embodiment of the present disclosure.

The magnetic memory structure 800 includes one top-electrode 110, one MTJ layers 820, the heavy-metal layer 130, the conductive layer 140, the insulation layer 150. The MTJ layer 820 is disposed above the heavy-metal layer 130. The conductive layer 140 is formed under the heavy-metal layer 130 and includes the first conductive portion 141 and the second conductive portion 142 separated from each other and connected with two end of the heavy-metal layer 130 respectively. The insulation layer 150 fills up an interval between the first conductive portion 141 and the second conductive portion 142.

The MTJ layer 820 includes the pinned-layer 121, a barrier-layer 822 and the free-layer 523, and the barrier-layer 822 lies between the pinned-layer 121 and the free-layer 523. The magnetic memory structure 800 includes the features similar to or the same as that of the magnetic memory structure 500 except that the barrier-layer 822 has structure different form that of the barrier-layer 122.

Furthermore, as shown in FIG. 17, the barrier-layer 822 has a lower surface 822b, the free-layers 523 has the upper surface 523u, and an area of the lower surface 822b is equal to that of the upper surface 523u. In addition, the pinned-layer 121, the barrier-layer 822 and the free-layer 523 overlap completely in top view. The barrier-layer 822 is shaped into a different shape to that of the barrier-layer 122.

Figure 18:
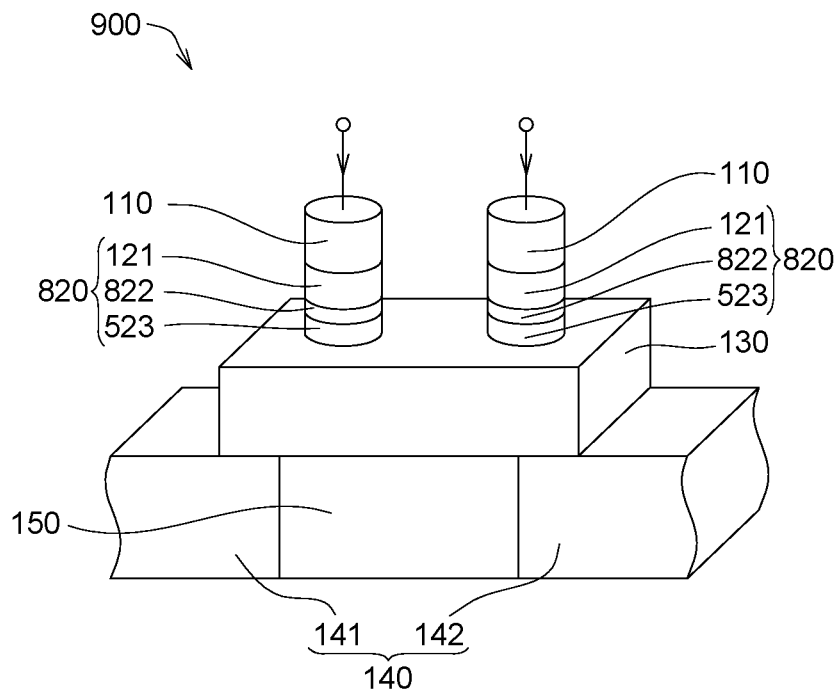
FIG. 18 illustrates a schematic diagram of a magnetic memory structure according to an embodiment of the present disclosure.

Referring to FIG. 18, FIG. 18 illustrates a schematic diagram of a magnetic memory structure 900 according to an embodiment of the present disclosure.

The magnetic memory structure 900 includes two top-electrodes 110, two MTJ layers 820, the heavy-metal layer 130, the conductive layer 140 and the insulation layer 150. The MTJ layers 820 are arranged in a string form and disposed above the heavy-metal layer 130.

Each MTJ layer 820 includes the pinned-layer 121, the barrier-layer 822 and the free-layer 523, and the barrier-layer 822 lies between the pinned-layer 121 and the free-layer 523. In the present embodiment, the pinned-layers 121 of the MTJ layers 820 are separated from each other, the barrier-layers 822 of the MTJ layers 820 are separated from each other, and the free-layers 523 of the MTJ layers 820 are separated from each other.

Figure 19:
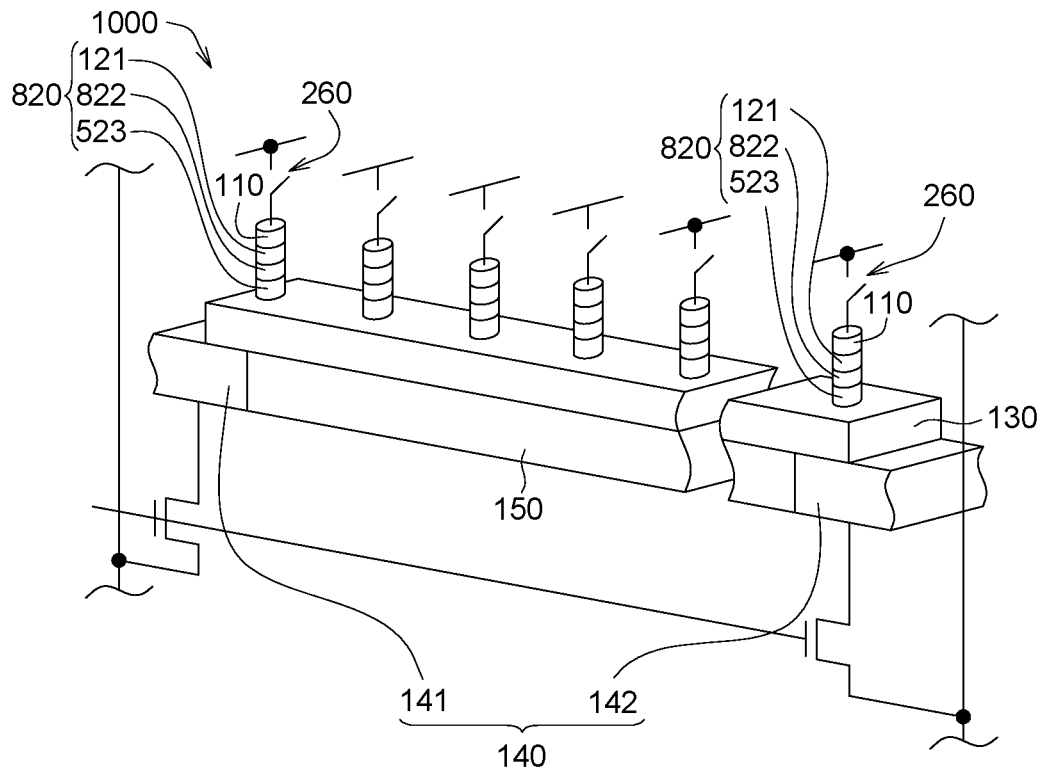
FIG. 19 illustrates a schematic diagram of a magnetic memory structure according to an embodiment of the present disclosure.

Referring to FIG. 19, FIG. 19 illustrates a schematic diagram of a magnetic memory structure 1000 according to an embodiment of the present disclosure. The magnetic memory structure 1000 includes a number of the top-electrodes 110, a number of the MTJ layers 820, the heavy-metal layer 130, the conductive layer 140, the insulation layer 150 and a number of the switches 260.

The magnetic memory structure 1000 includes the features similar to or the same as that of the magnetic memory structure 900 expect that the number of the top-electrodes 110, the number of pinned-layers 121, the number of the barrier-layers 822 and the number of the free-layers 523 are, for example, N, wherein N is positive integer equal to or greater than 3.

The magnetic memory structures in the present disclosures could be operated in low voltage. For example, the voltage $V_M$ required in the magnetic memory structure 1000 is lower than that of the magnetic memory structure 700, and the voltage $V_M$ required in the magnetic memory structure 700 is lower than that of the magnetic memory structure 400.

It will be apparent to those skilled in the art that various modifications and variations could be made to the disclosed embodiments. It is intended that the specification and examples be considered as exemplary only, with a true scope of the disclosure being indicated by the following claims and their equivalents.

What is claimed is:

1. A magnetic memory structure, comprising:
a heavy-metal layer;
a plurality of MTJ layers disposed above the heavy-metal layer;

a conductive layer formed under the heavy-metal layer and comprising a first conductive portion and a second conductive portion separated from each other and connected with two end of the heavy-metal layer respectively;

an insulation layer filling up an interval between the first conductive portion and the second conductive portion;

wherein the conductive layer has an electric conductivity higher than that of the heavy-metal layer.

2. The magnetic memory structure according to claim 1, wherein each MTJ layer comprises a pinned-layer, a barrier-layer and a free-layer, and the barrier-layer lies between the pinned-layer and the free-layer;

wherein the pinned-layers of the MTJ layers are separated from each other, the barrier-layers of the MTJ layers are connected with each other, and the free-layers of the MTJ layers are connected with each other.

3. The magnetic memory structure according to claim 2, wherein each barrier-layer has an upper surface, each pinned-layer has a lower surface, and an area of the first upper surface is larger than that of the lower surface.

4. The magnetic memory structure according to claim 2, wherein each barrier-layer has a lower surface, each free-layer has an upper surface, and an area of the lower surface is equal to that of the upper surface.

5. The magnetic memory structure according to claim 1, wherein each MTJ layer comprises a pinned-layer, a barrier-layer and a free-layer, and the barrier-layer lies between the pinned-layer and the free-layer;

wherein the free-layers of the MTJ layers are separated from each other, the pinned-layers of the MTJ layers are separated from each other, and the barrier-layers of the MTJ layers are connected with each other.

6. The magnetic memory structure according to claim 5, wherein each barrier-layer has a lower surface, each free-layer has an upper surface, and an area of the lower surface is larger than that of the upper surface.

7. The magnetic memory structure according to claim 1, wherein each MTJ layer comprises a pinned-layer, a barrier-layer and a free-layer, and the barrier-layer lies between the pinned-layer and the free-layer;

wherein the pinned-layers of the MTJ layers are separated from each other, the barrier-layers of the MTJ layers are separated from each other, and the free-layers of the MTJ layers are separated from each other.

8. The magnetic memory structure according to claim 7, wherein each barrier-layer has a lower surface, each free-layer has an upper surface, and an area of the lower surface is equal to that of the upper surface.

9. The magnetic memory structure according to claim 2, wherein the barrier-layer, the free-layer and the heavy-metal layer have a first lateral surface, a second lateral surface and a third lateral surface, and the first lateral surface, the second lateral surface and the third lateral surface are flush with each other.

10. The magnetic memory structure according to claim 1, wherein the conductive layer has an upper surface exposed from the heavy-metal layer.

11. The magnetic memory structure according to claim 1, wherein the heavy-metal layer has a lateral surface, and the conductive layer extends beyond the lateral surface of the heavy-metal layer.

12. The magnetic memory structure according to claim 1, wherein there is no conductive portion disposed with the interval between the first conductive portion and the second conductive portion.

13. The magnetic memory structure according to claim 1, further comprises:

a plurality of insulation portion each formed between the barrier-layer and the free-layer of the corresponding MTJ layer.

14. A magnetic memory structure, comprising:

a heavy-metal layer;

a MTJ layer disposed above the heavy-metal layer;

a conductive layer formed under the heavy-metal layer and comprising a first conductive portion and a second conductive portion separated from each other and connected with two end of the heavy-metal layer respectively;

an insulation layer filling up an interval between the first conductive portion and the second conductive portion;

wherein the conductive layer has an electric conductivity higher than that of the heavy-metal layer.

15. The magnetic memory structure according to claim 14, wherein the MTJ layer comprises a pinned-layer, a barrier-layer and a free-layer, and the barrier-layer lies between the pinned-layer and the free-layer, and the barrier-layer has a lower surface, the free-layer has an upper surface, and an area of the lower surface is larger than that of the upper surface.

* * * * *